US005655276A

United States Patent [19]

Pattanayak et al.

[11] Patent Number: 5,655,276

[45] Date of Patent: Aug. 12, 1997

[54] METHOD OF MANUFACTURING TWO-DIMENSIONAL ARRAY ULTRASONIC TRANSDUCERS

[75] Inventors: Deva Narayan Pattanayak, Niskayuna; Lowell Scott Smith, Schenectady, both of N.Y.

[73] Assignee: General Electric Company, Schenectady, N.Y.

[21] Appl. No.: 386,718

[22] Filed: Feb. 6, 1995

[51] Int. Cl.[6] ..................... H01L 41/22

[52] U.S. Cl. ..................... 29/25.35; 310/336; 367/155

[58] Field of Search ..................... 29/25.35; 367/155, 367/157; 310/336, 334, 337

[56] References Cited

U.S. PATENT DOCUMENTS 5,091,893 2/1992 Smith et al. .

*Primary Examiner*—Carl E. Hall

*Attorney, Agent, or Firm*—Marvin Snyder

[57] ABSTRACT

In fabricating a two-dimensional array transducer wherein individual preformed piezoelectric elements are manufactured separately in a high temperature ceramic firing process, a ceramic substrate is provided, having a surface with a plurality of electrodes thereon. A layer of dielectric material is formed on the substrate surface. Holes are formed in the dielectric material layer over the electrodes, defining cavities with metal pads at the bottoms. The individual preformed piezoelectric elements are then inserted into the holes; with one end of each element in contact with a corresponding one of the substrate electrodes. The holes are sized such that the piezoelectric elements are isolated from the dielectric layer. A ground plane conductor is then formed over the dielectric material layer and over the ends of the piezoelectric elements opposite the ends in contact with the piezoelectric elements, and is photolithographically patterned and may be etched to provide a "mesh" structure. The layer of dielectric material may then be removed to provide better isolation between the piezoelectric elements.

15 Claims, 4 Drawing Sheets

METHOD OF MANUFACTURING TWO-DIMENSIONAL ARRAY ULTRASONIC TRANSDUCERS

BACKGROUND OF THE INVENTION

The present invention relates to fabrication of ultrasonic array transducers, particularly two-dimensional array ultrasonic transducers, in which individual piezoelectric elements of the array can be placed in desired positions to form an array without the limitations imposed by mechanical dicing.

Ultrasonic array transducers, employed for example in medical applications, rely on wave interference for their beam forming effects, and typically employ a plurality of individual transducer elements organized as either a one-dimensional (linear) array or a two-dimensional array. Ultrasound imaging is a non-invasive technique for obtaining image information about the structure of an object which is hidden from view, and has become widely used as a medical diagnostic tool. Ultrasound is also used for non-destructive testing and analysis in the industrial arts. Medical ultrasonic transducer arrays typically operate at a frequency within the range of one to ten MHz, although higher frequencies are certainly possible.

A two-dimensional phased array of ultrasonic transducer elements is often designed to obtain image data in two dimensions, without requiring movement of the array transducer.

Medical ultrasonic transducer arrays conventionally are fabricated from a block of piezoelectric material within which individual elements are defined and isolated from each other by sawing at least partially through the block of piezoelectric material, making a number of cuts with a dicing saw. In the case of a one-dimensional (linear) array, a series of dicing saw cuts are made parallel to each other. In the fabrication of a two-dimensional array, a second series of saw cuts is made at right angles to the first set of dicing saw cuts.

One of the limitations of this conventional process is that the positions of the array elements are limited by the nature of the dicing process. In addition, there is little control over the characteristics of the individual piezoelectric elements.

Relevant to the subject invention is a high density interconnect structure, also known as HDI, disclosed in Eichelberger et al. U.S. Pat. No. 4,783,695, and related patents. Very briefly, this high density interconnect structure employs a ceramic substrate which is made of alumina, for example, with a thickness between 25 and 100 mils. Using known ceramic processing techniques, metallic connection electrodes may be provided on the surface of the ceramic substrates, and electrical connections are made to these electrodes through either surface or buried conductors.

In the conventional HDI fabrication process at least one cavity is made in the ceramic substrate, and the various components, including semiconductor integrated circuit "chips", are placed in desired locations within the cavities and adhered with a thermoplastic adhesive layer.

A multi-layer interconnect overcoat structure is then built up to electrically interconnect the components into an actual functioning system. To begin the HDI overcoat structure, a polyimide dielectric film, which may be Kapton polyimide, about 0.0005 to 0.003 inch (12.5 to 75 microns) thick and available from E. I. du Pont de Nemours & Company, Wilmington, Del., is pretreated to promote adhesion and coated on one side with a thermoplastic such as Ultem® polyetherimide resin, available from General Electric Company, Pittsfield, Mass., and laminated across the top of the chips, other components and the substrate, with the Ultem resin serving as a thermoplastic adhesive to hold the Kapton film in place.

The actual as-placed locations of the various components and contact pads thereon are determined, and via holes are adaptively laser drilled in the Kapton film and Ultem adhesive layers in alignment with the contact pads on the electronic components. Exemplary laser drilling techniques are disclosed in Eichelberger et al. U.S. Pat. Nos. 4,714,516 and 4,894,115; and in Loughran et al. U.S. Pat. No. 4,764,485.

A metallization layer deposited over the Kapton film layer extends into the via holes to make electrical contact to the contact pads disposed thereunder. This metallization layer may be patterned to form individual conductors during its deposition, or it may be deposited as a continuous layer and then patterned using photoresist and etching. The photoresist is preferably exposed using a laser which is scanned relative to the substrate to provide an accurately aligned conductor pattern at the end of the process. Exemplary techniques for patterning the metallization layer are disclosed in Wojnarowski et al. U.S. Pat. Nos. 4,780,177 and 4,842,677; and in Eichelberger et al. U.S. Pat. No. 4,835,704 which relates to an "Adaptive Lithography System to Provide High Density Interconnect". Any misposition of the individual electronic components and their contact pads is compensated for by an adaptive laser lithography system as disclosed in U.S. Pat. No. 4,835,704.

Additional dielectric and metallization layers are provided as required in order to make all of the desired electrical connections among the chips.

HDI techniques have also been employed in connection with ultrasonic transducers. For example, Smith et al. U.S. Pat. No. 5,091,893, issued Feb. 25, 1992, entitled "Ultrasonic Array with a High Density of Electrical Connections" and assigned to the instant assignee discloses a piezoelectric ultrasonic array transducer having its individual elements connected to external electronics via a high density interconnect structure fabricated employing the HDI techniques briefly mentioned above. However, the individual piezoelectric elements in the Smith et al. ultrasonic array are formed employing the conventional dicing technique.

SUMMARY OF THE INVENTION

Accordingly, one object of the invention is to provide a process for making an array of ultrasonic transducers where the array elements can be placed at will without the restrictions imposed by the dicing process.

Another object of the invention is to provide a method for making an array ultrasonic transducer wherein individual array elements can be screened independently prior to being incorporated into the transducer.

Briefly, in accordance with the invention, a substrate is provided having a surface with a plurality of electrodes thereon, and electrical connections to the electrodes. Preferably in one embodiment, the substrate is a ceramic substrate such as is employed in the HDI fabrication process briefly summarized hereinabove.

A layer of dielectric material is formed on the substrate surface, either by an appropriate deposition technique or by applying a polymer layer. Preferably, the layer of dielectric material is a sacrificial layer which is removed as a subsequent step in the fabrication process.

Next, holes are formed in the dielectric material layer over the electrodes, thus defining cavities with metal pads at the bottoms. The holes may be formed for example by laser ablation, in the case of a polymer dielectric layer, or by photolithography techniques.

Individual preformed piezoelectric elements are provided, manufactured separately in a high temperature ceramic firing process. In one approach, individual preformed piezoelectric elements are made by providing a sheet of "green" ceramic material, firing the ceramic material, and then cutting the individual elements from the ceramic material. Alternatively, the piezoelectric elements may be made by forming green ceramic material into precursors of the piezoelectric elements, and then firing the precursors to form the final piezoelectric elements.

Next, the individual piezoelectric elements are placed in the holes, with one end of each of the piezoelectric elements in contact with a corresponding one of the substrate electrodes. In one approach, a quantity of piezoelectric elements are distributed on the layer of dielectric material and mechanically agitated such that the piezoelectric elements fall into the holes in the direct orientations, as the particles are made to fit the cavities and the cavities are slightly larger than the particles in cross-sectional area. Alternatively, a robotic device may be employed to individually place the piezoelectric elements into corresponding holes or cavities.

At least one conductor is then formed over the dielectric material layer and over opposite ends of the piezoelectric elements in contact with the piezoelectric elements, thereby to provide a "ground" plane (although not all of the piezoelectric elements need be connected to the same "ground" plane). This conductor can be photolithographically patterned and etched to provide a mesh structure as may be desired.

In the process of the invention as summarized up to this point, isolation between the individual piezoelectric elements and the dielectric material is provided by forming holes in the dielectric material wider than the piezoelectric elements.

Preferably, however, as a further step, the layer of dielectric material is removed to provide better isolation between the piezoelectric elements, which then essentially are separated from each other by air gaps. A selective etchant appropriate to the particular dielectric material can be employed.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings, in which:

DETAILED DESCRIPTION

Figure 1:
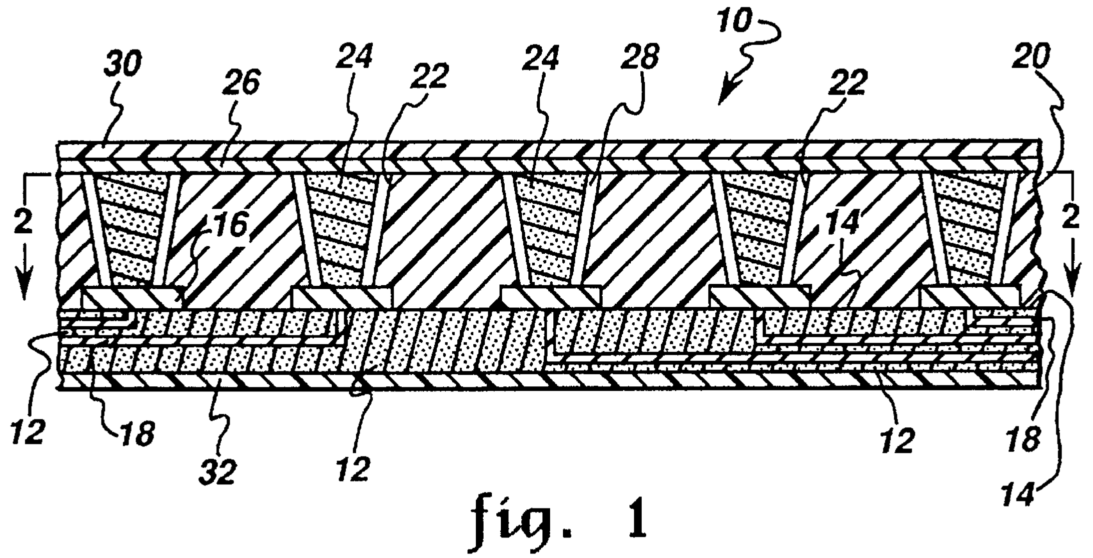
FIG. 1 is a cross-sectional view of an array ultrasonic transducer fabricated in accordance with the invention.
Figure 2:
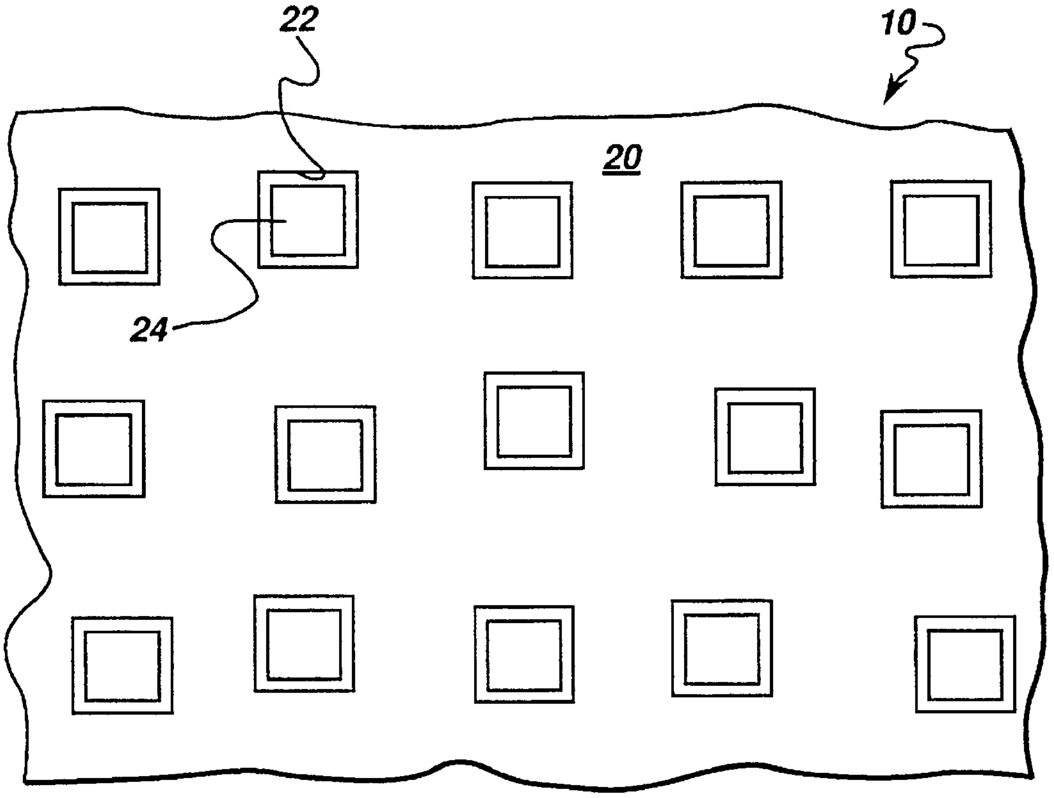
FIG. 2 is a view taken along line 2—2 of FIG. 1, depicting an arbitrary pattern of piezoelectric element positions.

As shown in FIGS. 1 and 2, an array ultrasonic transducer 10 includes a substrate 12 having a surface 14 on which a plurality of pads or electrodes 16 are formed. Electrical connections to electrodes 16 are provided by buried conductors 18, for example. It will be appreciated that buried conductors 18 as illustrated are highly schematic and representative only, as such conductors may be provided in various layers and with appropriate via structures, as is well known in the art of fabricating cofired ceramic substrates. Alternatively, in some instances, electrical connections to electrodes 16 are provided by conductors on substrate surface 14. Pads or electrodes 16 comprise conductive materials compatible with the HDI process, such as copper or titanium. To avoid unduly perturbing the acoustic properties of transducer 10, it is desirable that substrate 12 containing buried conductors 18 be relatively thin compared to the thickness of the overlying active piezoelectric structure.

On substrate surface 14 is a layer 20 of dielectric material having holes or cavities 22 formed therein, with pads or electrodes 16 at the bottoms of the cavities. The cavities may be arranged in a rectangular grid although, as shown in FIG. 2, they may be spaced from each other irregularly. An example of a suitable dielectric material 20 is a photoresist material, such as Fanton, available from Armstrong World Industries. An alternative dielectric layer material 20 is a polyimide such as Kapton.

Individual piezoelectric elements or particles 24 are disposed within cavities 22, and are interconnected by a conductive ground plane layer 26, which preferably is patterned into a suitable mesh configuration. Mechanical isolation between piezoelectric elements 24 is provided by gaps 28 between the sidewalls of cavities 22 and piezoelectric elements 24.

Preferably, for a two-dimensional array, the dimensions of pads 16 are in the order of $\lambda/2\times\lambda/2$, where $\lambda$ is the wavelength in the imaging medium. The center-to-center separation of pads or electrodes 16 is also in the order of $\lambda/2\times\lambda/2$. For a linear array, the length dimensions can be longer. As a more specific example, for a 5 MHz transducer, the linear dimensions of pads 16 are in the order of 6 mils. For a 50 MHz transducer, the linear dimensions are in the order of 0.6 mils.

The thickness of dielectric layer 20 matches the height of the individual piezoelectric elements 24. As an example, for a 3.5 MHz device, the dielectric layer 20 thickness is typically 15 mils.

Preferably, an appropriate acoustic matching layer 30 is employed over mesh ground plane 26 on the front or active surface of transducer 10. Also, to provide acoustic loading and to reduce ringing, a suitable backing layer 32 is situated over the back surface of transducer 10. Such measures improve the efficiency and spectral response of the array.

Figure 3:
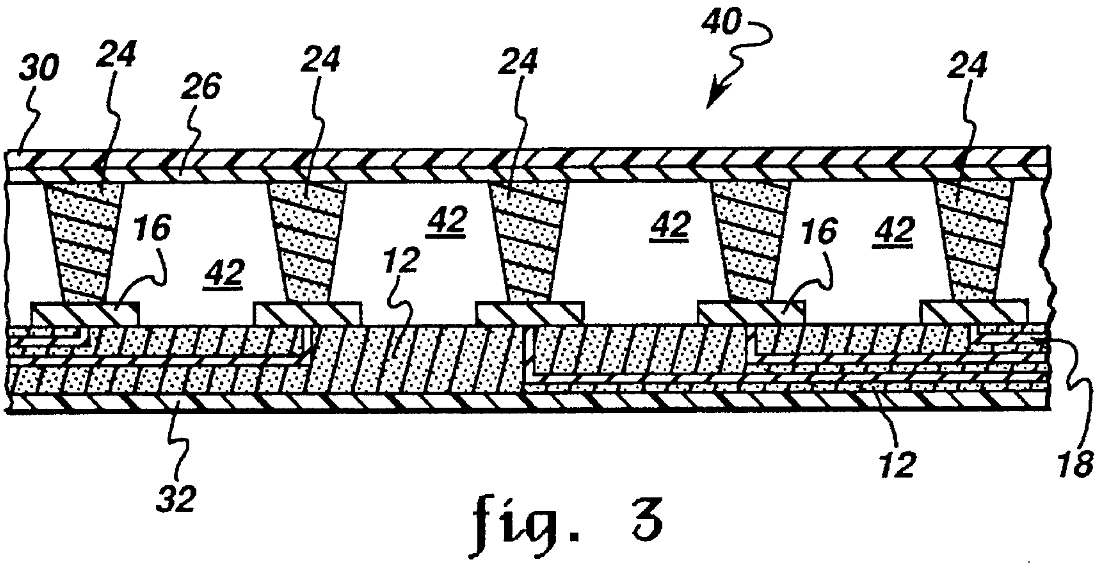
FIG. 3 is a cross-sectional view similar to that of FIG. 1, differing in that the layer of dielectric material has here been removed for improved isolation between individual piezoelectric elements.

FIG. 3 depicts an alternative array ultrasonic transducer structure 40, which differs from transducer 10 of FIGS. 1 and 2 in that dielectric material layer 20 of FIG. 1 is not present, having been removed by a selective etching process, for example. Thus there are relatively wide air gaps 42 between individual piezoelectric elements 24 for improved isolation. As still another alternative, dielectric material layer 20 of FIG. 1 may be removed and replaced with a material providing high acoustic isolation, such as a silicone rubber, or a rigid or semi-rigid foam structure having air bubbles incorporated therein.

Figure 4:
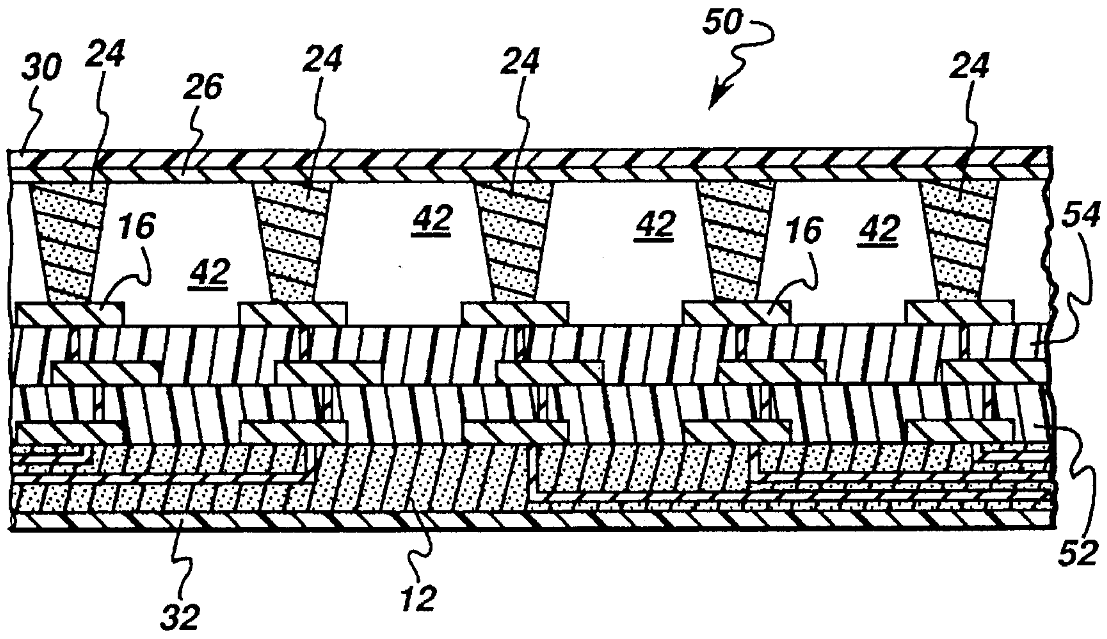
FIG. 4 is a cross-sectional view of an array ultrasonic transducer employing an alternative form of substrate.

FIG. 4 illustrates another alternative structure wherein pads or electrodes 16, rather than being formed directly on ceramic substrate 12, are formed on intermediate Kapton dielectric layers 52 and 54 fabricated by employing the HDI process described hereinabove.

An important aspect of the invention is that piezoelectric elements 24 are formed separately in a high temperature process, and may have properties superior to those of piezoelectric elements formed by the prior art dicing process. Such properties may include, for example, enhanced electromechanical conversion efficiency and control of undesirable lateral modes of vibration. Furthermore, individual piezoelectric elements 24 can be screened independently before being incorporated into transducer 10.

Piezoelectric elements 24 are formed by a ceramic firing process. A modification of the known tape casting process can be used to form ceramic particles 24. Ordinarily, tape thickness is not especially uniform, with thickness variations of ±10%. Preferably, calendaring is employed to improve tape uniformity.

In one approach, in accordance with the invention, the green ceramic tape is fired or sintered, and only later are electrodes deposited on the large flat surface of the tape. In this way, the top and bottom surfaces of the tape are provided with metal electrodes.

Individual elements are then cut from the tape using either conventional dicing saws, or laser-assisted machining.

As an alternative approach, precursors of the piezoelectric elements are formed from the green ceramic material, such as by stamping the calendared tape, or a comb-like structure is defined. The precursors may, alternatively, be produced by injection molding of the ceramic. The precursors are fired, and the final elements are then appropriately removed from the resultant structure, for example, the comb-like structure.

In either event, contraction of the ceramic material which inherently takes place during the firing process is taken into account when forming the particles.

Figure 5A:
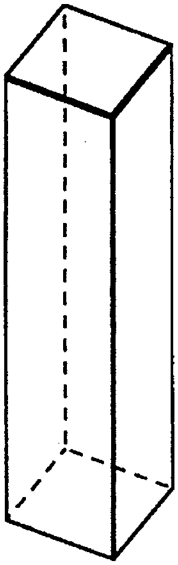
FIGS. 5A, 5B and 5C illustrate different piezoelectric element shapes.
Figure 5B:
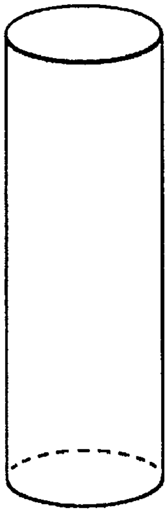
Figure 5C:
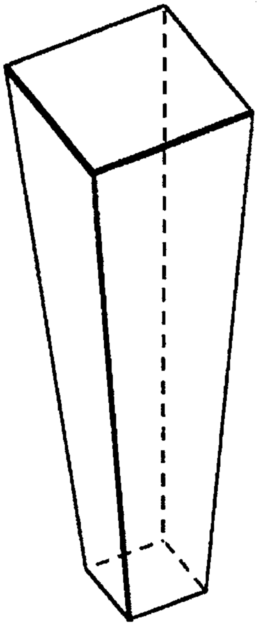

FIGS. 5A, 5B and 5C illustrate typical configurations of ultrasonic transducer elements. Typically, for the example of a 3.5 MHz device, the transducer elements of FIGS. 5A, 5B and 5C are approximately 15 mils in height, and have lateral dimensions in the order of 6 mils.

As shown in FIGS. 6A through 6D, the fabrication method of the invention includes the step of providing substrate 12, having surface 14 with a plurality of electrodes 16 thereon, with electrical connections 18 to electrodes 16 as described hereinabove with reference to FIG. 1.

Figure 6A:
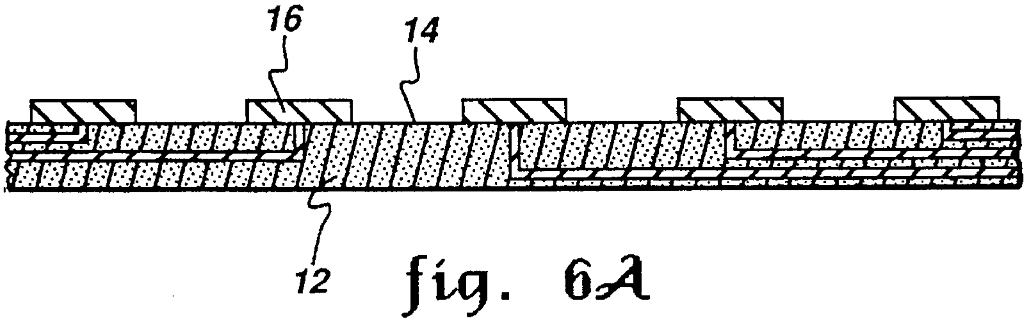
FIGS. 6A, 6B, 6C and 6D illustrate steps in the fabrication process of the invention.
Figure 6B:
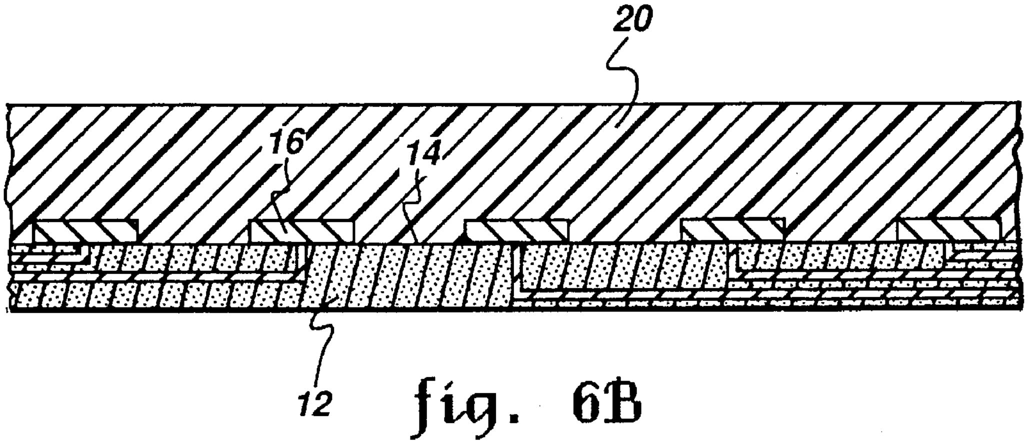

Next, as illustrated in FIG. 6B, layer 20 of dielectric material is formed on substrate surface 16, such as by applying a layer of Fanton photoresist material which is, for example, 15 mils thick. As an alternative, layer 20 may be formed of a polyimide film material pre-treated to promote adhesion by being coated on one side with a polyetherimide resin or another thermoplastic, and laminated across surface 14 and pads 16.

Figure 6C:
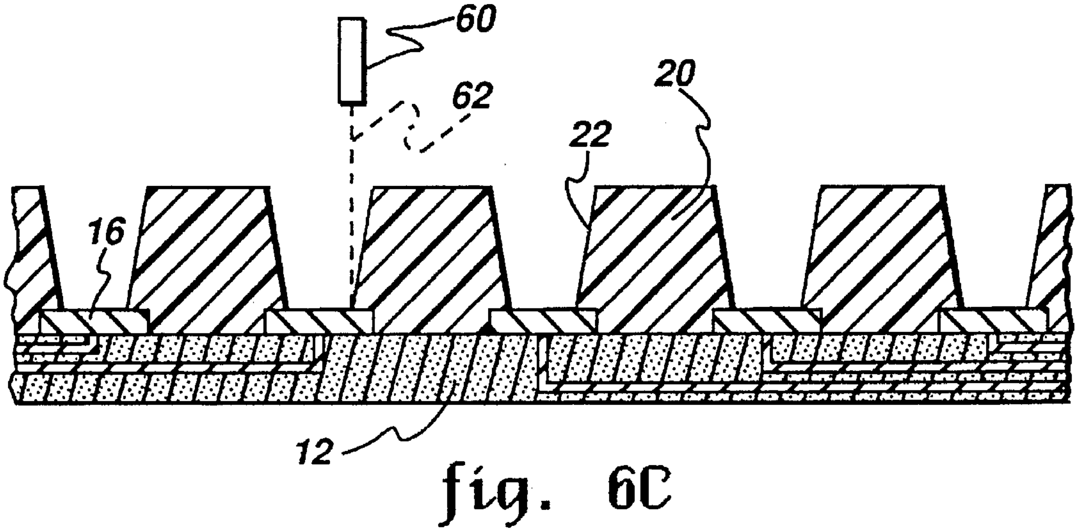

Next, as illustrated in FIG. 6C, holes or cavities 22 are formed in alignment with pads 16, such as by laser drilling or ablation employing a suitable controlled laser 60 emitting a beam 62 which is dithered in an appropriate pattern to form cavity 22. Alternatively, depending upon the particular material of layer 20, cavities 22 may be formed using photolithographic masking and etching techniques.

Figure 6D:
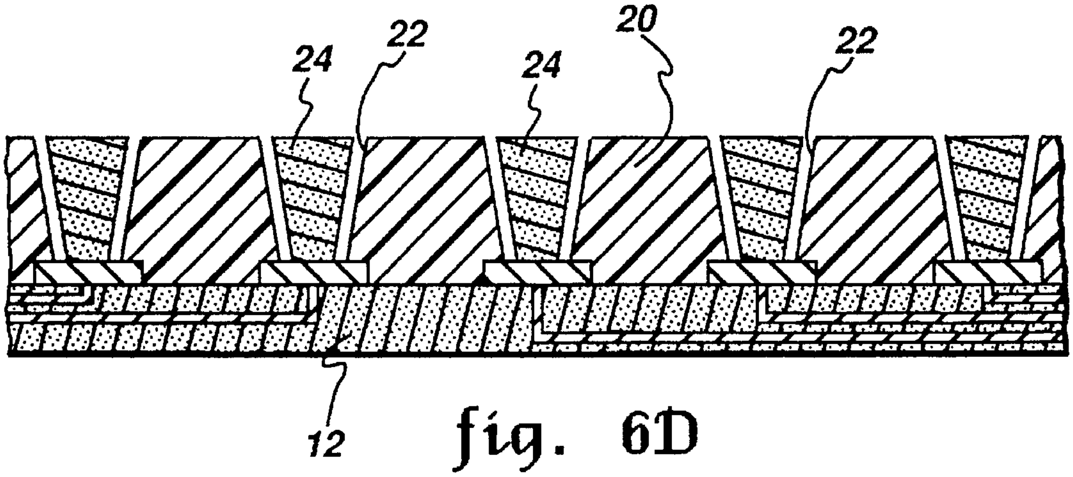

Next, individual preformed piezoelectric elements are placed in cavities 22, resulting in the configuration of FIG. 6D.

By simply agitating piezoelectric particles distributed on the top surface, cavities 22 are filled with piezoelectric elements 24 in the correct positions as the piezoelectric elements 24 are designed to fit cavities 22 and each of cavities 22 is slightly larger in cross-sectional area than a piezoelectric particle. In some cases, it is necessary to carry out this process in a vacuum, and to employ appropriate measures to avoid the effects of electrostatic forces.

Alternatively, a mechanical robotic device may be employed to position piezoelectric elements 24 individually in cavities 22.

Once piezoelectric elements 24 are in place, the top surface is connected, as shown in FIG. 1, for example, to form ground plane 26 for piezoelectric elements 24 as needed. Ground plane layer 26 may be deposited by vacuum deposition or sputtering, and then patterned, as by etching, to provide a mesh structure.

Acoustic matching layer 30 and backing layer 32 are then affixed to the front and back surfaces, respectively, of the array transducer, resulting in the structure of FIG. 1.

Finally, as an optional step, sacrificial dielectric layer 20 of FIG. 1 is removed. This may be accomplished by employing a selective etchant such as KOH, or a patternable etching process such as plasma etching. This results in the structure of FIG. 3.

At an appropriate time, a high voltage is applied to polarize the piezoelectric elements.

The invention thus provides a method for producing array ultrasonic transducers wherein individual piezoelectric array elements can be placed at will, without the restrictions imposed by a dicing process, and with element isolation achieved in a simple manner without dicing. The arrays can be made random, if desired. The individual piezoelectric elements are formed separately in a high temperature process, and thus can have ultrasonic properties of higher quality than elements defined by dicing. Moreover, the individual elements can be screened independently before being incorporated into a transducer.

While specific embodiments of the invention have been illustrated and described herein, many modifications and changes will occur to those skilled in the art. It is therefore to be understood that the appended claims are intended to cover all such modifications and changes as fall within the true spirit and scope of the invention.

What is claimed is:

1. A method for making an array ultrasonic transducer, comprising:

providing a substrate having a surface with a plurality of electrodes thereon;

forming a layer of dielectric material on the substrate surface;

forming holes in the dielectric material layer over the electrodes;

providing individual preformed piezoelectric elements;

placing the individual preformed piezoelectric elements in the holes such that one end of each of the piezoelectric elements makes contact with a corresponding one of the substrate electrodes; and forming at least one conductor over the dielectric material layer and over ends of the piezoelectric elements opposite the ends in contact with the piezoelectric elements.

2. The method of claim 1 which comprises, as a final step, removing the layer of dielectric material to provide isolation between the piezoelectric elements.

3. The method of claim 2 wherein the step of removing the layer of dielectric material comprises selectively etching said dielectric material.

4. The method of claim 1 which comprises, as a final step, replacing the layer of dielectric material with a layer of material providing high acoustic isolation.

5. The method of claim 1 wherein the step of forming holes in the dielectric material layer comprises forming holes of greater cross-sectional area than the piezoelectric elements to provide mechanical isolation between the piezoelectric elements and the dielectric material.

6. The method of claim 1 wherein the step of providing a substrate comprises providing a ceramic substrate.

7. The method of claim 1 wherein the step of forming a layer of dielectric material on the substrate surface comprises applying a layer of photoresist material on said substrate surface.

8. The method of claim 1 wherein the step of forming holes in the dielectric material layer comprises photolithographically removing portions of said dielectric material layer.

9. The method of claim 1 wherein the step of forming a layer of dielectric material on the substrate surface comprises applying a polymer layer onto the substrate surface.

10. The method of claim 9 wherein the step of forming holes in the dielectric material layer comprises laser-ablating portions of said dielectric material layer.

11. The method of claim 1 including, as a final step, patterning said one conductor into a mesh configuration.

12. The method of claim 1, wherein the step of providing individual preformed piezoelectric elements comprises:

providing a sheet of green ceramic material;

firing the ceramic material; and cutting individual elements from the ceramic material.

13. The method of claim 1 wherein the step of providing individual preformed piezoelectric elements comprises:

providing green ceramic material;

forming the green ceramic material into precursors of piezoelectric elements; and firing said precursors.

14. The method of claim 1 wherein the step of placing the individual preformed piezoelectric elements in the holes comprises distributing a quantity of piezoelectric elements on the layer of dielectric material and mechanically agitating the substrate and layer of dielectric material such that the piezoelectric elements fall into the holes.

15. The method of claim 1 wherein the step of placing individual preformed piezoelectric elements in the holes comprises robotically placing the individual piezoelectric elements into corresponding holes.

* * * * *